(12) United States Patent
Lee et al.

(10) Patent No.: US 12,402,343 B2
(45) Date of Patent: Aug. 26, 2025

(54) WORK FUNCTION TUNING IN SEMICONDUCTOR DEVICES

(71) Applicant: Taiwan Semiconductor Manufacturing Company, Ltd., Hsinchu (TW)

(72) Inventors: Hsin-Yi Lee, Hsinchu (TW); Sheng-Yung Chang, Hsinchu (TW); Cheng-Lung Hung, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 359 days.

(21) Appl. No.: 17/807,513

(22) Filed: Jun. 17, 2022

(65) Prior Publication Data
US 2023/0317446 A1 Oct. 5, 2023

Related U.S. Application Data

(60) Provisional application No. 63/324,851, filed on Mar. 29, 2022.

(51) Int. Cl.
*H10D 30/01* (2025.01)
*H10D 30/67* (2025.01)
(Continued)

(52) U.S. Cl.
CPC ....... *H10D 30/024* (2025.01); *H10D 30/6735* (2025.01); *H10D 30/6211* (2025.01); *H10D 62/119* (2025.01)

(58) Field of Classification Search
CPC ............ H10D 30/024; H10D 30/6211; H10D 62/119; H10D 30/797; H10D 30/43; H10D 62/822; H10D 64/667; H10D 30/014; H10D 30/6757; H10D 62/121; H10D 64/017; H10D 64/685; H10D 64/691; H10D 64/68;
(Continued)

(56) References Cited

U.S. PATENT DOCUMENTS 6,495,474 B1 * 12/2002 Rafferty ................ H01L 29/518
                                                                    438/785
9,093,530 B2    7/2015 Huang et al.
(Continued)

FOREIGN PATENT DOCUMENTS

KR    20140142957 A    12/2014
KR    20200051079 A     5/2020
(Continued)

*Primary Examiner* — Fernando L Toledo
*Assistant Examiner* — Adam S Bowen
(74) *Attorney, Agent, or Firm* — Sterne, Kessler, Goldstein Fox P.L.L.C.

(57) ABSTRACT

The present disclosure describes a method for forming a semiconductor device having a work function metal layer doped with tantalum to mitigate oxygen diffusion and improve device threshold voltage. The method includes forming a gate dielectric layer on a channel structure and forming a work function metal layer on the gate dielectric layer. The gate dielectric layer includes an interfacial layer on the channel structure and a high-k dielectric layer on the interfacial layer. The method further includes doping the work function metal layer and the gate dielectric layer with tantalum.

20 Claims, 20 Drawing Sheets

(51) Int. Cl.
*H10D 30/62* (2025.01)
*H10D 62/10* (2025.01)

(58) Field of Classification Search
CPC ............... H01L 21/0217; H01L 21/762; H01L 29/42392; H01L 29/66795; H01L 21/02164; H01L 29/0669; H01L 29/7851; H01L 21/3115
See application file for complete search history.

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,892,923 B2 * | 2/2018 | Dekkers | H01L 21/28088 |
| 10,074,725 B1 * | 9/2018 | Chou | H01L 27/0924 |
| 10,665,685 B2 * | 5/2020 | Lin | H01L 21/823437 |
| 11,476,121 B2 | 10/2022 | Wang et al. | |
| 2009/0297696 A1 | 12/2009 | Pore et al. | |
| 2016/0196976 A1 | 7/2016 | Dekkers et al. | |
| 2020/0203149 A1 * | 6/2020 | Huang | H01L 21/02524 |
| 2021/0126105 A1 * | 4/2021 | Hsu | H01L 29/401 |
| 2021/0159118 A1 | 5/2021 | Lakshmanan et al. | |
| 2021/0376096 A1 | 12/2021 | Vellianitis et al. | |
| 2021/0407819 A1 * | 12/2021 | Wei | H01L 21/3212 |

FOREIGN PATENT DOCUMENTS

| | | |
|---|---|---|
| TW | 201917781 A | 5/2019 |
| TW | 202203384 A | 1/2022 |

\* cited by examiner

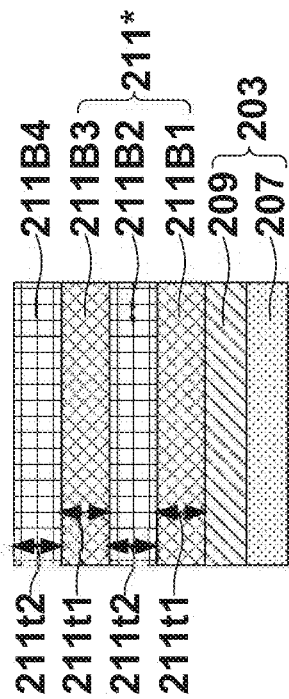
FIG. 15A
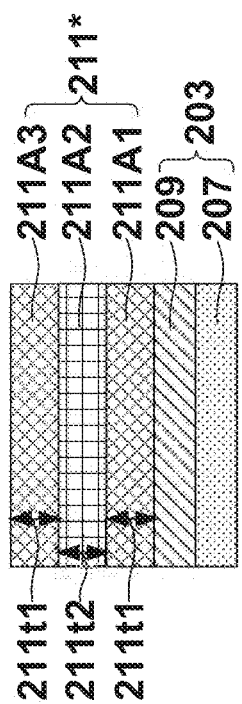
FIG. 15B
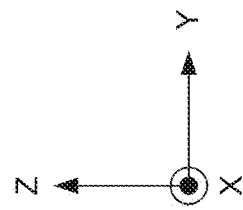

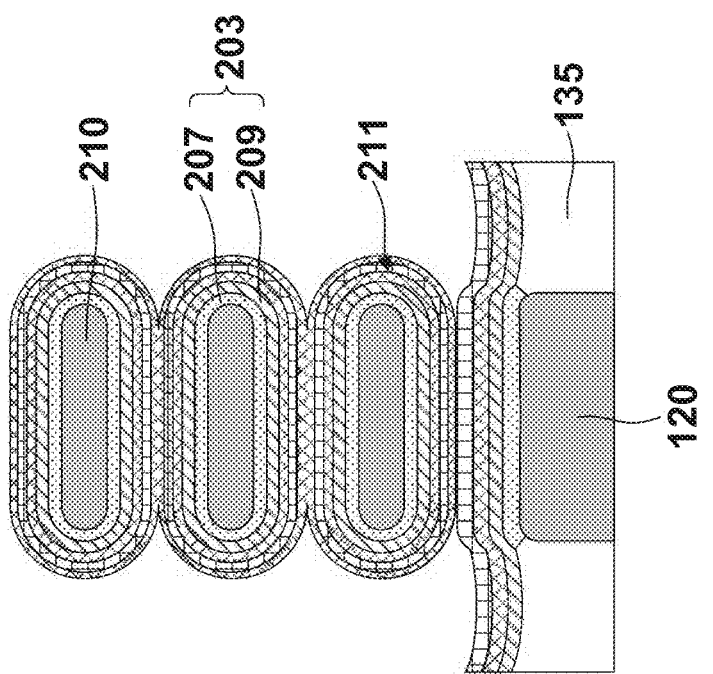
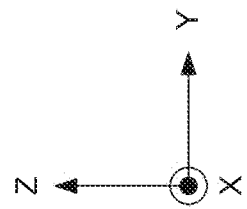
FIG. 16

WORK FUNCTION TUNING IN SEMICONDUCTOR DEVICES

CROSS-REFERENCE TO RELATED APPLICATION

This application claims the benefit of U.S. Provisional Patent Application No. 63/324,851, titled "Tantalum Soak Method for P Work Function Tuning," which was filed on Mar. 29, 2022 and is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around field effect transistors (GAAFETs). Such scaling down has introduced challenges to improve the performance of semiconductor devices.

BRIEF DESCRIPTION OF THE DRAWINGS

Aspects of the present disclosure are best understood from the following detailed description when read with the accompanying figures.

FIGS. 7-10, 11A-11C, 12-14, 15A-15B, and 16-20 illustrate various partial cross-sectional views of a semiconductor device having a work function metal layer doped with tantalum at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
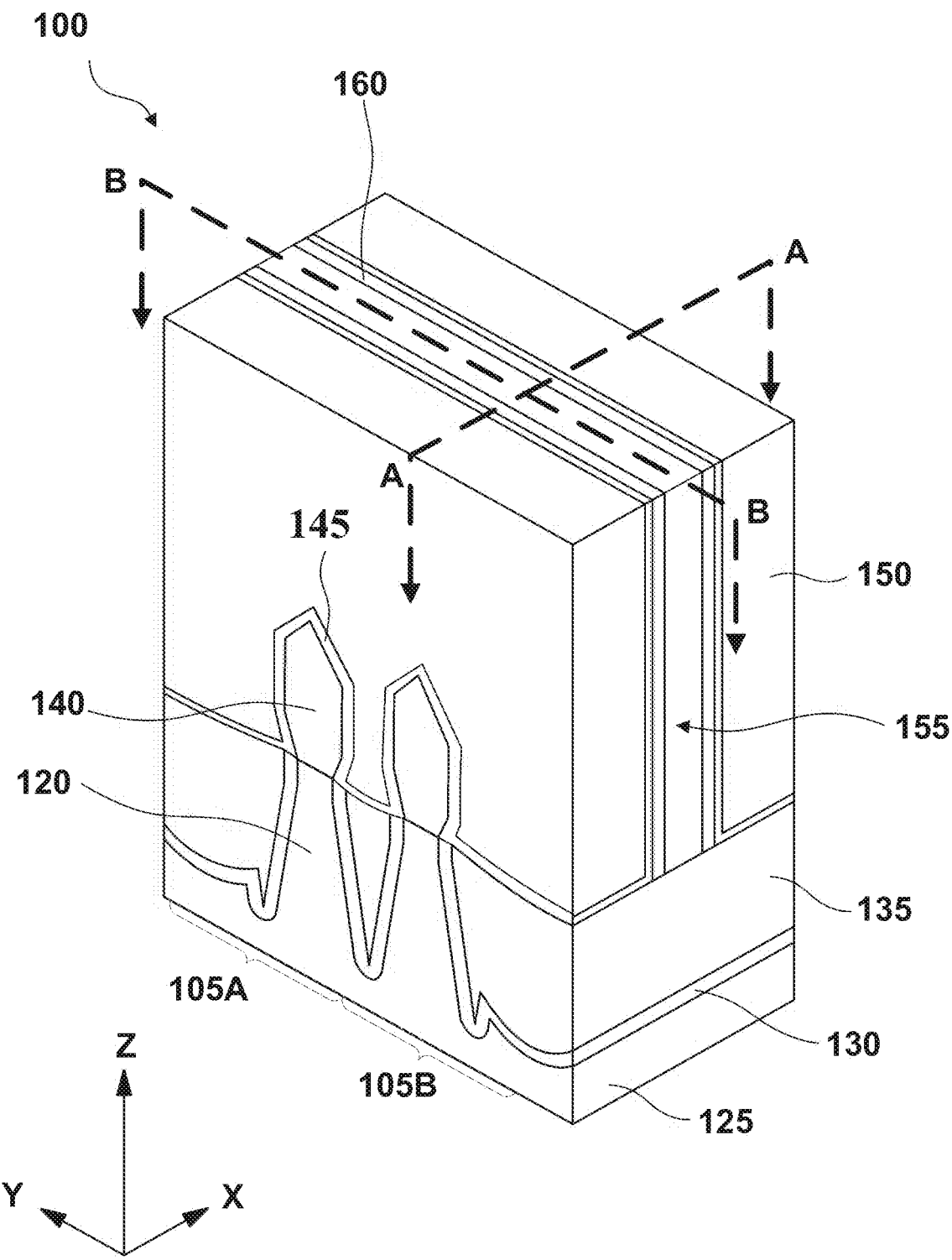
FIGS. 1, 2, 3A, 3B, and 4 illustrate isometric and cross-sectional views of a semiconductor device having a work function metal layer doped with tantalum, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, +5% of the value) These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller semiconductor devices, dimensions of semiconductor devices continue to scale down. The continuous scaling down of device dimensions and the increasing demand for device performance may require various process and material improvements, which can lead to various challenges. For example, n-type field effect transistors (also referred to as "NFETs") and p-type field effect transistors (also referred to as "PFETs") can be manufactured with different threshold voltages ($V_t$) suitable for each type of FET. The term "p-type" can be associated with a structure, layer, and/or region doped with p-type dopants, such as boron. The term "n-type" can be associated with a structure, layer, and/or region doped with n-type dopants, such as phosphorus. Devices can have different work function metal layers for different $V_t$. The work function metal layers for NFET can be referred to as "n-type work function metal layers" and the work function metal layers for PFET can be referred to as "p-type work function metal layers."

The work function metal layers for NFET can include titanium aluminum (TiAl), titanium nitride (TiN), and other suitable work function materials. The work function metal layers for PFET can include titanium nitride (TiN), titanium silicon nitride (TiSiN), tungsten nitride (WN), tungsten carbon nitride (WCN), and other suitable work function materials. During the manufacturing process of p-type work function metal layers, subsequent processes may be in a different chamber and the surface of the p-type work function metal layers may be oxidized during the process, The oxygen at the surface can diffuse into gate dielectric layer of PFET, The gate dielectric layer can include a high-k dielectric layer and an interfacial layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). The interfacial layer can include silicon oxide, germanium oxide, or silicon germanium oxide. The diffused oxygen in the high-k dielectric layer and the interfacial layer can lead to $V_t$ shifts in PFETs. For example, the $V_t$ can increase about 20 mV to about 100 mV due to oxygen diffusion. The $V_t$ shift can significantly degrade the device performance of PFETs.

Various embodiments of the present disclosure provide methods for forming a semiconductor device having a work function metal layer doped with tantalum to prevent oxygen diffusion into the gate dielectric layer and improve device threshold voltage. In some embodiments, a gate dielectric layer can be formed on a channel structure of a semiconductor device. The gate dielectric layer can include a high-k dielectric layer and an interfacial layer. A work function metal layer can be formed on the gate dielectric layer. In some embodiments, the work function metal layer and the gate dielectric layer can be doped with tantalum by a soak process with a tantalum precursor. The tantalum in the work function metal layer and the gate dielectric layer can attract oxygen and prevent oxygen from diffusing into the gate dielectric layer. In some embodiments, the work function metal layer can include one or more tantalum nitride layers to dope tantalum in the work function metal layer and the gate dielectric layer and thus to mitigate oxygen diffusion. In some embodiments, the work function metal layer can include titanium tantalum nitride (TiTaN) to mitigate oxygen diffusion. The tantalum in the TiTaN work function metal layer can have a concentration ranging from about 0.05% to about 25%, and the tantalum can diffuse into the gate dielectric layer to attract oxygen and mitigate oxygen diffusion. In sonic embodiments, the tantalum concentration in the work function metal layer and the gate dielectric layer can range from about 0.05% to about 25%. In some embodiments, with tantalum doping in the work function metal layer and the gate dielectric layer, $V_t$ shifts in PFETs can be reduced by about 20 mV to about 100 mV and device performance of the semiconductor device can be improved.

FIGS. 1, 2, 3A, 3B, and 4 illustrate isometric and cross-sectional -views of a semiconductor device 100 having a work function layer doped with tantalum, in accordance with sonic embodiments. As shown in FIG. 1, semiconductor device 100 includes a FET 105A and a FET 105B formed on a substrate 125. In some embodiments, FETs 105A and 105B can be finFETs, planar FETs, nanostructure transistors, or other suitable FET devices. The nanostructure transistors can include nanosheet transistors, nanowire transistors, multi bridge channel transistor, nano-ribbon transistor, etc. The nanostructure transistors provide a channel in a stacked nanosheet/nanowire configuration. Though FIGS. 1, 2, 3A, 3B, and 4 illustrate FETs 105A and 105B as nanostructure transistors, FETs 105A and 105B can be any suitable FET devices. In some embodiments, FETs 105A and 105E can be both PFETs, both NFETs, or one of each conductivity type FET. Though FIG. 1 shows two FETs, semiconductor device 100 can have any number of FETs similar to FETs 105A and 105B. Also, though FIG. 1 show one gate structure 155, semiconductor device 100 can have additional gate structures similar and parallel to gate structure 155. The discussion of elements of FETs 105A and 105B with the same annotations applies to each other, unless mentioned otherwise.

As shown in FIG. 1, FETs 105A and 105B can be formed on substrate 125. In some embodiments, substrate 125 can include a semiconductor material, such as crystalline silicon (Si). In some embodiments, substrate 125 can include (i) an elementary semiconductor, such as germanium (Ge); (ii) a compound semiconductor including silicon carbide (SiC), silicon arsenide (SiAs), gallium arsenide (GaAs), gallium phosphide (GaP), and/or a III-V semiconductor material; (iii) an alloy semiconductor including silicon germanium (SiGe), silicon germanium carbide (SiGeC), germanium stannum (GeSn), and/or aluminum gallium arsenide (AlGaAs); (iv) a silicon-on-insulator (SOI) structure; (v) a silicon germanium (SiGe)-on insulator (SiGeOI) structure; (vi) germanium-on-insulator (GeOI) structure; or (vii) a combination thereof. Alternatively, the substrate can be made from an electrically non-conductive material, such as glass and sapphire wafer. Further, substrate 125 can be doped depending on design requirements (e.g., p-type substrate or n-type substrate). In some embodiments, substrate 125 can be doped with p-type dopants (e.g., boron, indium, aluminum, or gallium) or n-type dopants (e.g., phosphorus or arsenic). For example purposes, substrate 125 will be described in the context of crystalline Si. Based on the disclosure herein, other materials, as discussed above, can be used. These materials are within the spirit and scope of this disclosure.

Referring to FIG. 1, semiconductor device 100 can include additional structural elements, such as fin structures 120, a liner 130, an insulating layer 135, source/drain (S/D) structures 140, an etch stop layer 145, an isolation layer 150, a gate structure 155 formed in isolation layer 150, and gate spacers 160 formed on sidewall surfaces of gate structure 155.

Fin structures 120 may be formed on substrate 125 by patterning with any suitable method. For example, fin structures 120 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 120. In some embodiments, fin structures 120 can include semiconductor materials similar to substrate 125. In some embodiments, fin structures 120 can include crystalline Si. In some embodiments, tin structures 120 are optional.

In some embodiments, insulating layer 135 can be an isolation structure, such as a shallow trench isolation (STI), that provides electrical isolation between FETs 105A and 105B from each other and from neighboring FETs (not shown) on substrate 125 and/or neighboring active and passive elements (not shown) integrated with or deposited on substrate 125. In some embodiments, an insulating layer can be a layer that functions as an electrical insulator (e.g., a dielectric layer). In some embodiments, insulating layer 135 can include silicon oxide ($SiO_2$), silicon nitride ($Si_3N_4$), silicon oxynitride (SiON), fluorine-doped silicate glass (FSG), phosphorous-doped silicate glass (PSG), a low-k dielectric material (e.g., with k-value less than about 3.9), and/or other suitable dielectric materials with appropriate fill properties. In some embodiments, liner 130 is a nitride layer, such as silicon nitride.

Referring to FIG. 1, S/D structures 140 can be disposed on fin structures 120 and abut gate spacers 160, extending along an X-axis within isolation layer 150. In some embodiments, S/D structures 140 can have any geometric shape, such as a polygon, an ellipse, and a circle. S/D structures 140 can include an epitaxially-grown semiconductor material. In some embodiments, the epitaxially-grown semiconductor material includes the same material as substrate 125. In some embodiments, the epitaxially-grown semiconductor material includes a different material from substrate 125. In some embodiments, the epitaxially-grown semiconductor material for each of S/D structures 140 can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 140 can be p-type for a PFET and n-type for an NFET. In some embodiments, p-type S/D structures 140 can include SiGe and can be in-situ doped during an epitaxial growth process using p-type dopants, such as boron, indium, and gallium. In some embodiments, p-type S/D structures 140 can have multiple sub-regions that can include SiGe and can differ from each other based on, for example, doping concentrations, epitaxial growth process conditions, and/or a relative concentration of Ge with respect to Si. In some embodiments, n-type S/D structures 140 can include Si and can be in-situ doped during an epitaxial growth process using n-type dopants, such as phosphorus and arsenic. In some embodiments, n-type S/D structures 140 can have multiple n-type epitaxial fin sub-regions that can differ from each other based on, for example, doping concentration and/or epitaxial growth process conditions, Referring to FIG. 1, etch stop layer 145 can extend over insulating layer 135, S/D structures 140, and gate spacers 160, In some embodiments, etch stop layer 145 can function as a layer to stop etching in a subsequent etching process during the formation of S/D contact openings on S/D structures 140. In some embodiments, etch stop layer 145 can be deposited by a conformal deposition process, such as atomic layer deposition (ALD), plasma-enhanced ALD (PEALD), chemical vapor deposition (CVD), plasma-enhanced CVD (PECVD), and any other suitable deposition method.

Isolation layer 150 can surround S/D structures 140 and can be formed prior to the formation of gate structure 155. In some embodiments, isolation layer 150 can be an interlayer dielectric (ILD) that includes a silicon oxide-based dielectric material with or without carbon and/or nitrogen. In some embodiments, isolation layer 150 can be deposited by CVD, flowable CVD (FCVD), or any other suitable deposition method.

Gate spacers 160 can be a stack of one or more layers that include the same or different materials. In some embodiments, gate spacers 160 can include a dielectric material, such as silicon oxynitride (SiON), silicon carbonitride (SiCN), silicon oxycarbide (SiOC), silicon nitride, or a combination thereof. According to some embodiments, gate spacers 160 can be disposed on sidewall surfaces of gate structure 155. Gate spacers 160 can have a low-k material with a dielectric constant less than about 3.9 (e.g., about 3.5, about 3.0, or about 2.8).

Figure 2:
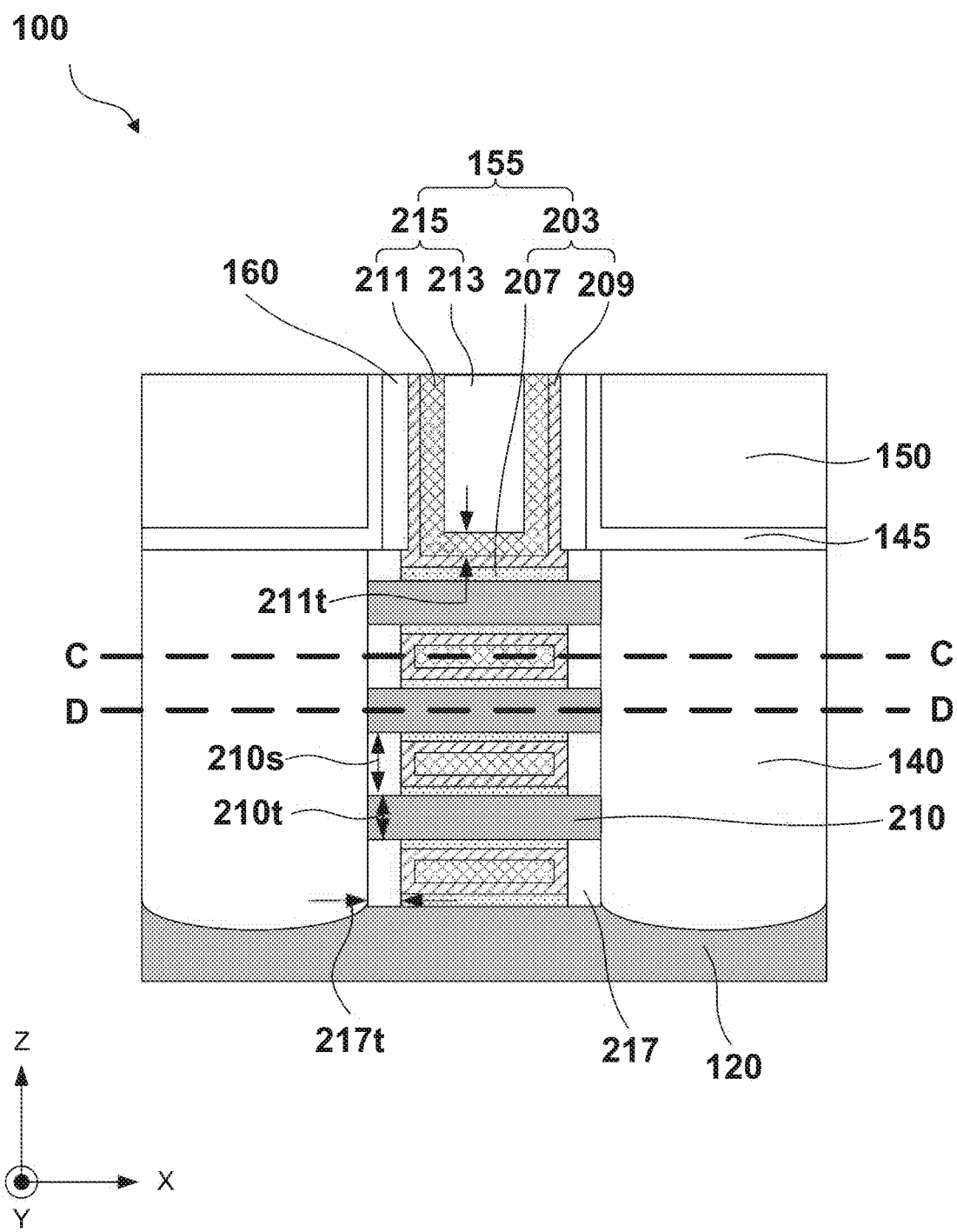
Figure 3B:
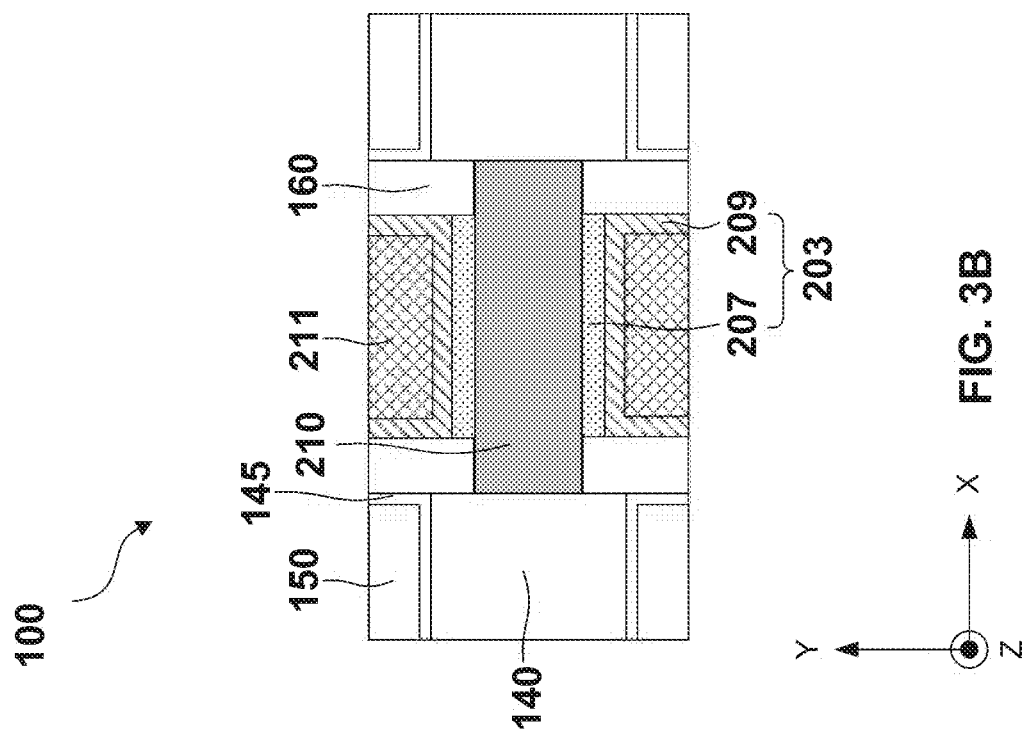
Figure 3A:
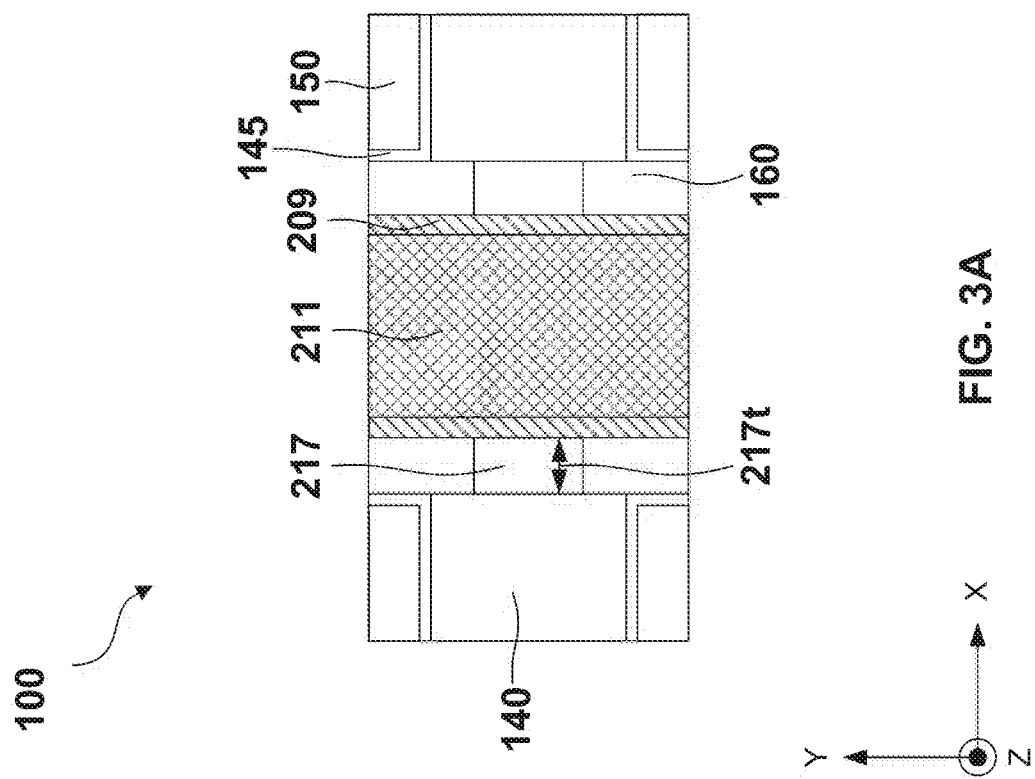
Figure 4:
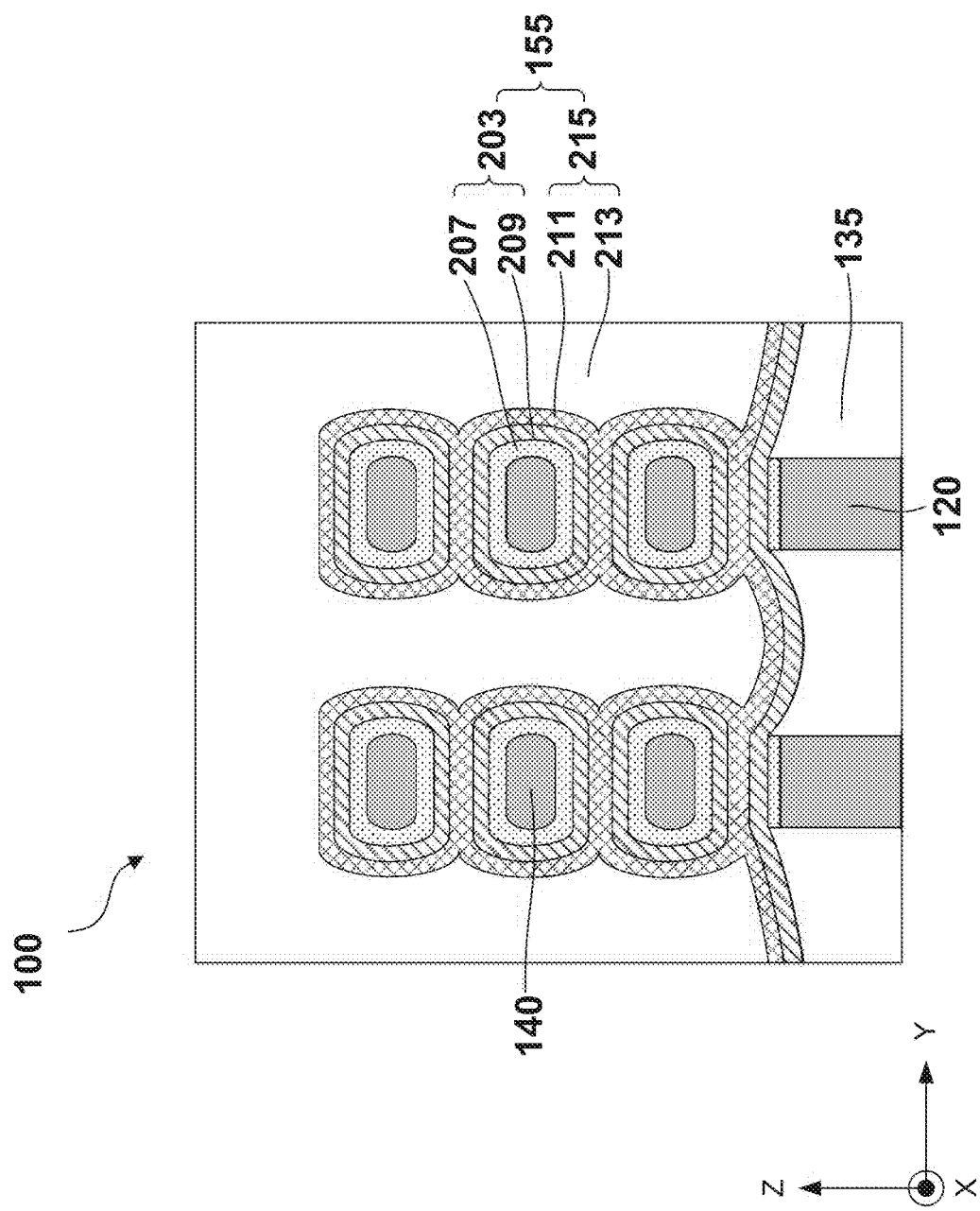

Gate structure 155 can be multi-layered structures and can be disposed above fin structures 120. Gate structure 155 can include a gate dielectric layer 203 and a metal gate 215, as shown in detail in FIGS. 2, 3A, 3B, and 4. FIG. 2 illustrates a cross-sectional view of semiconductor device 100 across line A-A in FIG. 1, in accordance with some embodiments. FIG. 3A illustrates a top-down view of semiconductor device 100 across line C-C in FIG. 2, in accordance with some embodiments. FIG. 3B illustrates a top-down view of semiconductor device 100 across line D-D in FIG. 2, in accordance with some embodiments. FIG. 4 illustrates a cross-sectional view of semiconductor device 100 across line B-B in FIG. 1, in accordance with some embodiments.

As shown in FIGS. 2, 3A, 3B, and 4, gate dielectric layer 203 can include an interfacial layer 207 and a high-k dielectric layer 209. In some embodiments, interfacial layer 207 can include silicon oxide, germanium oxide, or silicon germanium oxide with a thickness from about 5 Å to about 15 Å. In some embodiments, high-k dielectric layer 209 can include a dielectric material with a dielectric constant (k-value) higher than about 3.9. In some embodiments, high-k dielectric layer 209 can include hafnium oxide, aluminum oxide, zirconium oxide, or other suitable high-k dielectric materials deposited by ALD, CVD, or PEALD with a thickness from about 10 Å to about 75 Å.

In some embodiments, gate dielectric layer 203 can be doped with tantalum to mitigate oxygen diffusion to interfacial layer 207 and the interface between interfacial layer 207 and high-k dielectric layer 209, In some embodiments, the concentration of the doped tantalum in interfacial layer 207 and high-k dielectric layer 209 can range from about 0.05% to about 25%. If the tantalum concentration is less than about 0.05%, the doped tantalum may not be able to prevent oxygen from diffusing to interfacial layer 207 and the interface between interfacial layer 207 and high-k dielectric layer 209. As a result, the electrical performance of semiconductor device 100 may not be improved. If the tantalum concentration is greater than about 25%, the excessive tantalum may cause defects in gate dielectric layer 203 and decrease the uniformity of gate dielectric layer 203. The decrease of the uniformity of gate dielectric layer 203 can degrade the electrical performance of semiconductor device 100.

In some embodiments, metal gate 215 can include a work function metal layer 211 and a metal fill 213. Work function metal layer 211 can include work function metals to tune $V_t$ of FETs 105A and 105B. In some embodiments, work function layer 211 can include p-type work function metals, such as TiN, TiSiN, WN, WCN, or other suitable work function metals, In some embodiments, work function layer 211 can include a single metal layer or a stack of metal layers. The stack of metal layers can include work function metals having work function values equal to or different from each other. In some embodiments, as shown in FIG. 2, work function metal layer 211 can have a thickness 211$t$ ranging from about 1 nm to about 10 nm. If thickness 211$t$ is less than about 1 nm, $V_t$ of FETs 105A and 105B may be less than the required value (e.g., from about 50 mV to about 500 mV). If thickness 211$t$ is greater than about 10 nm, $V_t$ of FETs 105A and 105B may be greater than required value (e.g., from about 50 mV to about 500 mV).

In some embodiments, work function metal layer 211 can be doped with tantalum to mitigate oxygen diffusion to interfacial layer 207 and the interface between interfacial layer 207 and high-k dielectric layer 209. In some embodiments, the concentration of the doped tantalum in work function metal layer 211 can range from about 0.05% to about 25%. if the tantalum concentration is less than about 0.05%, the doped tantalum may not be able to prevent oxygen from diffusing to interfacial layer 207 and the interface between interfacial layer 207 and high-k dielectric layer 209. As a result, the electrical performance of semiconductor device 100 may not be improved. If the tantalum concentration is greater than about 25%, the excessive tantalum may cause defects in gate dielectric layer 203 and decrease the uniformity of gate dielectric layer 203. The decrease of the uniformity of gate dielectric layer 203 can degrade the electrical performance of semiconductor device 100.

In some embodiments, metal fill 213 can include titanium, tantalum, aluminum, cobalt, tungsten, nickel, ruthenium, or other suitable conductive materials. In some embodiments, interfacial layer 207 and a high-k dielectric layer 209 can wrap around nanostructures 210. One or more layers of work function metal layer 211 and metal fill 213 can fill the spaces between nanostructures 210. Accordingly, gate structure 155 can be referred to as "gate-all-around (GAA) structures" and FETs 105A and 105B can be referred to as "GAA FETs."

As shown in FIGS. 2, 3A, 3B, and 4, semiconductor device can further include nanostructures 210 and inner spacer structures 217. In some embodiments, nanostructures 210 can include a stack of semiconductor layers (e.g., a stack of nanosheets, nanowires, nanoribbons, or nano-fork sheets for GAA FETs). In some embodiments, nanostructures 210 can include semiconductor materials similar to or different from fin structures 120. In some embodiments, nanostructures 210 and fin structures 120 can include a semiconductor material the same as substrate 125, such as crystalline Si. In some embodiments, nanostructures 210 can include silicon germanium. In some embodiments, as shown in FIG. 2, nanostructures 210 can have a thickness 210t along a Z-axis ranging from about 5 nm to about 10 nm. In some embodiments, adjacent nanostructures 210 can have a spacing 210s along a Z-axis ranging from about 5 nm to about 15 nm.

In some embodiments, inner spacer structures 217 can isolate gate structures 155 and S/D structures 140. Inner spacer structures 217 can include insulating materials, such as silicon oxide, silicon nitride, SiON, SiCN, SiOC, silicon oxycarbonitride (SiOCN), a low-k material, and a combination thereof. In some embodiments, inner spacer structures 217 and gate spacers 160 can include the same insulating material. In some embodiments, inner spacer structures 217 and gate spacers 160 can include different insulating materials. Inner spacer structures 217 can include a single layer or a stack of insulating layers. In some embodiments, inner spacer structures 217 can have a low-k material with a dielectric constant less than about 3.9 (e.g., about 3.5, about 3.0, or about 2.8). In some embodiments, inner spacer structures 217 can have a thickness 217t along an X-axis ranging from about 4 nm to about 8 nm.

Referring to FIGS. 1, 2, 3A, 313, and 4, nanostructures 210 can be current-carrying structures for respective FEB 105A. and 105B. Channel regions of FETs 105A and 105B can be formed in portions of their respective nanostructures 210. As a result, nanostructures 210 can be referred to as "channel structures." S/D structures 140 can function as S/D regions of respective FETs 105A and 105B.

Figure 5:
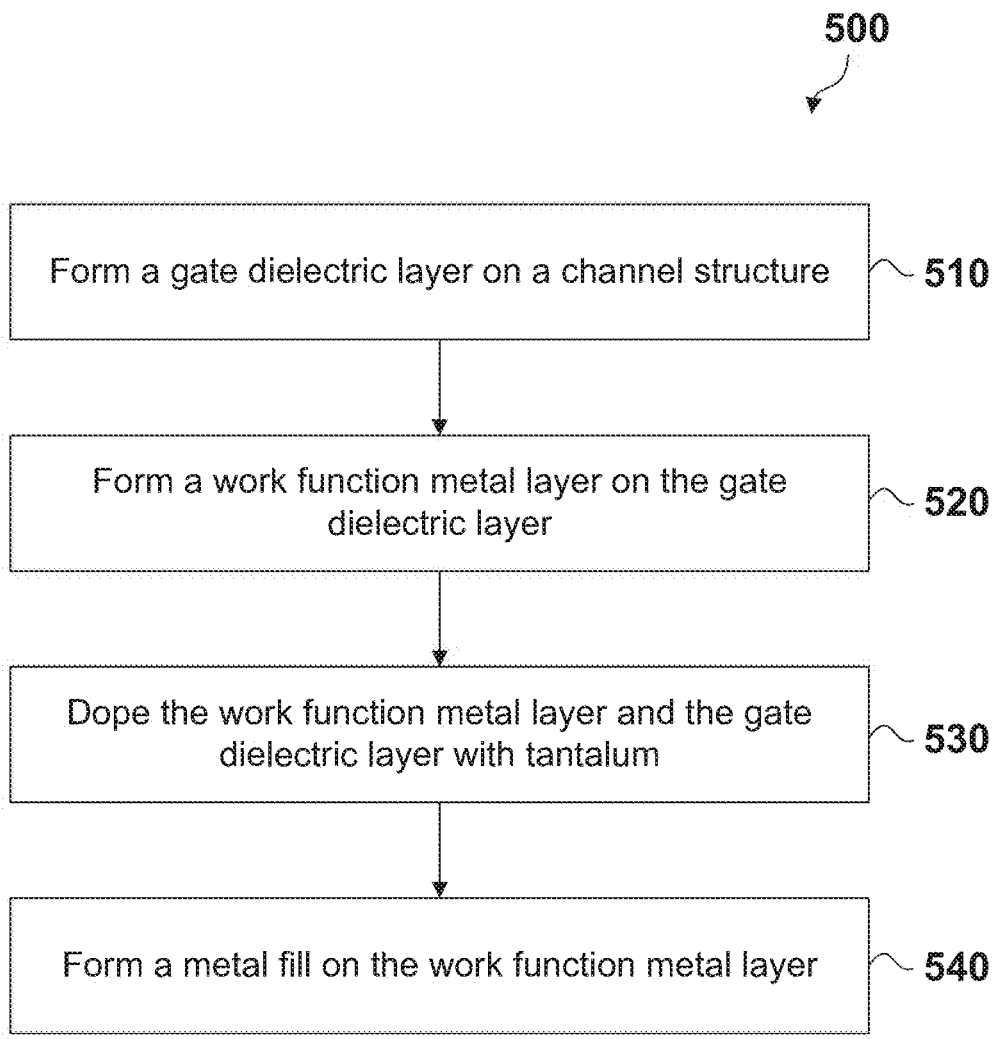
FIG. 5 is a flow diagram of a method for fabricating a semiconductor device having a work function metal layer doped with tantalum, in accordance with some embodiments.

FIG. 5 is a flow diagram of method 500 for fabricating a semiconductor device having a work function metal layer doped with tantalum, according to some embodiments. Method 500 may not be limited to nanostructure devices and can be applicable to other devices that would benefit from tantalum doped work function metal layer, such as planar FETs, finFETs, etc. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

Figure 6:
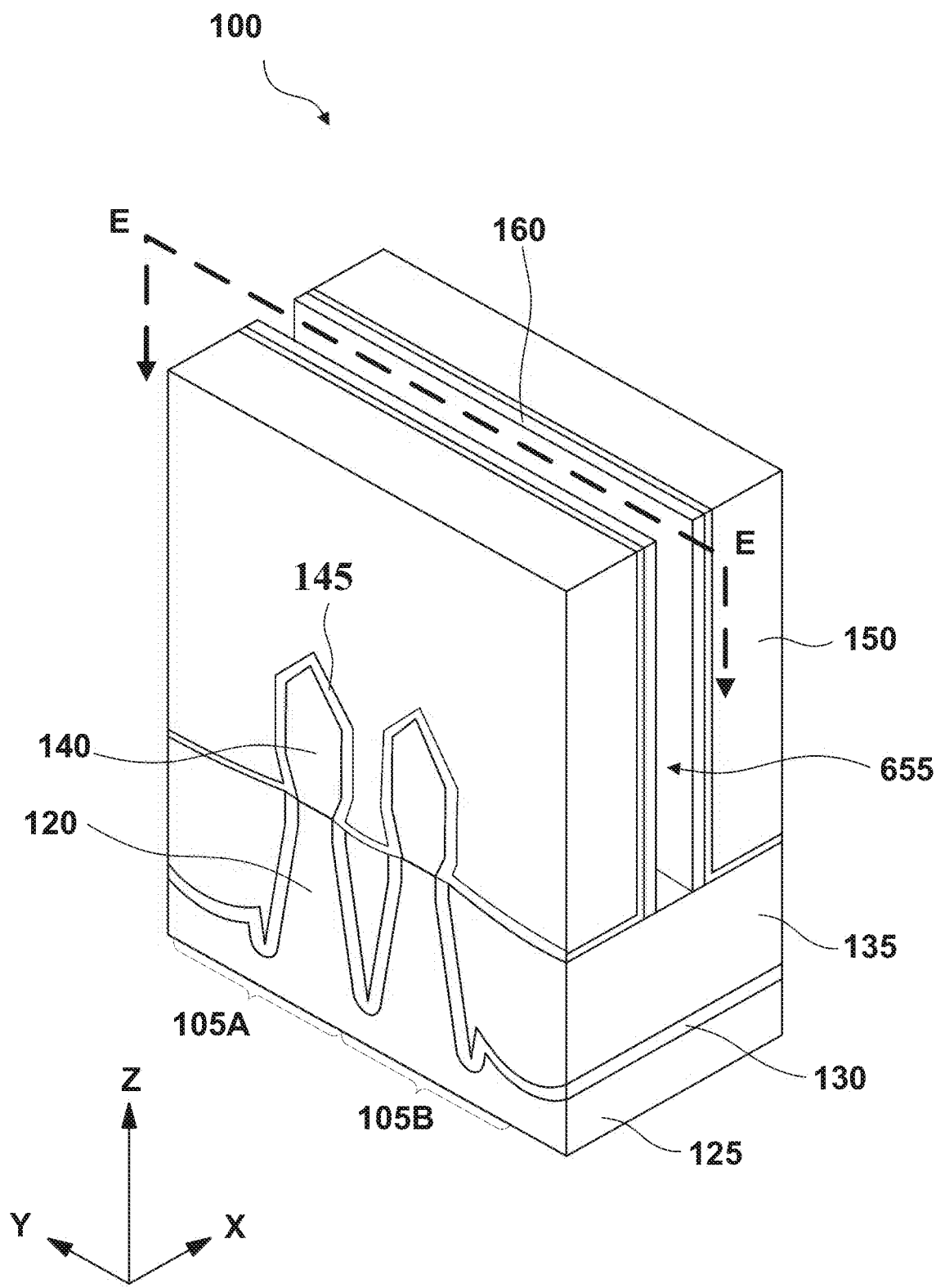
FIG. 6 illustrates an isometric view of a partially-fabricated semiconductor device, in accordance with some embodiments.

For illustrative purposes, the operations illustrated in FIG. 5 will be described with reference to the example fabrication process for fabricating semiconductor device 100 having a tantalum doped work function metal layer as illustrated in FIGS. 6-10, 11A-111C, 12-14, 15A-15B, and 16-20. FIG. 6 illustrates an isometric view of a partially-fabricated semiconductor device 100, in accordance with some embodiments. FIGS. 7-10, 11A-11C, 12-14, 15A-15B, and 16-20 illustrate partial cross-sectional views of semiconductor device 100 having tantalum doped work function metal layer 211 at various stages of its fabrication process, in accordance with some embodiments. One of FET 105A or FET 105B in semiconductor device 100 is illustrated in FIGS. 7-10, 11A-11C, 12-14, 15A-15B, and 16-20 for simplicity. Although FIGS. 6-10, 11A-11C, 12-14, 15A-15B, and 16-20 illustrate tantalum doping in work function metal layer 211 and gate dielectric layer 203 for semiconductor device 100, method 500 can be applied to other semiconductor devices, such as planar FETs, finFETs, and other suitable devices. Elements in FIGS. 6-10, 11A-11C, 12-14, 15A-15B, and 16-20 with the same annotations as elements in FIGS. 1, 2, 3A, 3B, and 4 are described above.

Figure 7:
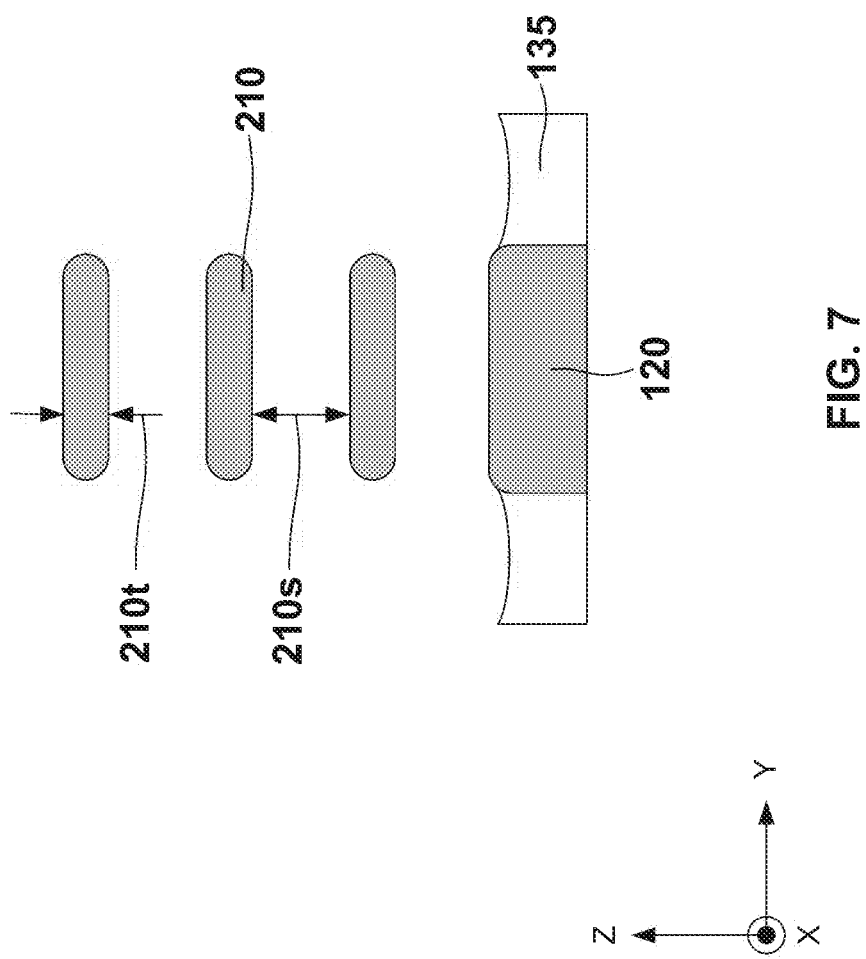
Figure 8:
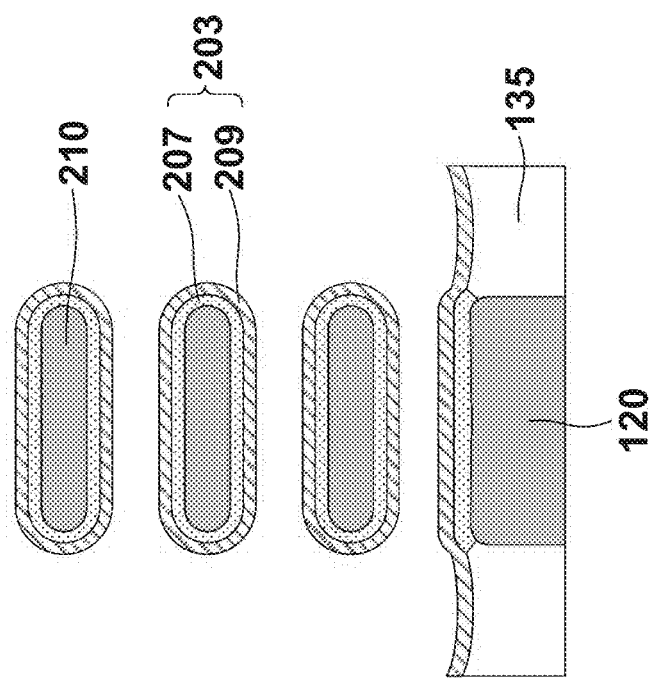

Referring to FIG. 5, method 500 begins with operation 510 and the process of forming a gate dielectric layer on a channel structure. For example, as shown in FIGS. 6-8, gate dielectric layer 203 can be formed on nanostructures 210. According to some embodiments, FIG. 6 illustrates an isometric views of partially-fabricated semiconductor device 100 after the removal of a sacrificial gate stack. After the removal of the sacrificial gate stack, a gate stack opening 655 can be formed between gate spacers 160. FIG. 7 illustrates a partial cross-sectional view of semiconductor device 100 across line E-E in FIG. 6, in accordance with some embodiments. FIG. 8 is a cross-sectional view of semiconductor device 100 shown in FIG. 7 after operation 510 of method 500. As shown in FIGS. 6 and 7, after the removal of the sacrificial gate stack, nanostructures 210 can be formed in gate stack opening 655 between S/D structures 140. In some embodiments, as shown in FIG. 7, nanostructures 210 can have thickness 210t along a Z-axis ranging from about 5 nm to about 110 nm. In some embodiments, adjacent nanostructures 210 can have spacing 210s along a Z-axis ranging from about 5 nm to about 15 nm. Nanostructures 210 can be current-carrying structures for FETs 105A and 105B and can form the channel regions of FETs 105A and 105B. As a result, nanostructures 210 can be referred to as "channel structures" of FETs 105A and 105B.

As shown in FIG. 8, gate dielectric layer 203 can be formed on nanostructures 210, fin structures 120, and insulating layer 135. Gate dielectric layer 203 can be formed in gate stack opening 655 between gate spacers 160, as shown in FIG. 6. In some embodiments, gate dielectric layer 203 can include interfacial layer 207 and high-k dielectric layer 209. In some embodiments, interfacial layer 207 can be formed by exposing the silicon surfaces of nanostructures 210 and fin structures 120 to an oxidizing ambient. In some embodiments, the oxidizing ambient can include a combination of ozone ($O_3$), ammonia hydroxide/hydrogen peroxide/water mixture (SC1), and hydrochloric acid/hydrogen peroxide/water mixture (SC2). As a result of the aforementioned oxidation process, a silicon oxide layer between about 5 Å and about 15 Å can be formed on exposed silicon surfaces, such as the surfaces of nanostructures 210 and fin structures 120 in gate stack opening 655, but not on insulating layer 135. Therefore, gate dielectric layer 203 on nanostructures 210 and fin structures 120 can include interfacial layer 207 and high-k dielectric layer 209, and gate dielectric layer 203 on insulating layer 1135 can include only high-k dielectric layer 209, according to some embodiments. In some embodiments, interfacial layer 207 can include a silicon oxide layer with a thickness from about 5 Å to about 15 Å and deposited by ALD, CVD, or any other suitable deposition method. As a result of the deposition process, the silicon oxide layer can cover nanostructures 210, fin structures 120, and insulating layer 135. In some embodiments, high-k dielectric layer 209 can include a dielectric material with a dielectric constant (k-value) higher than about 3.9. In some embodiments, high-k dielectric layer 209 can include hafnium oxide, aluminum oxide, zirconium oxide, or other suitable high-k dielectric materials deposited by ALD, CVD, or PEALD with a thickness from about 10 Å to about 75 Å.

Figure 9:
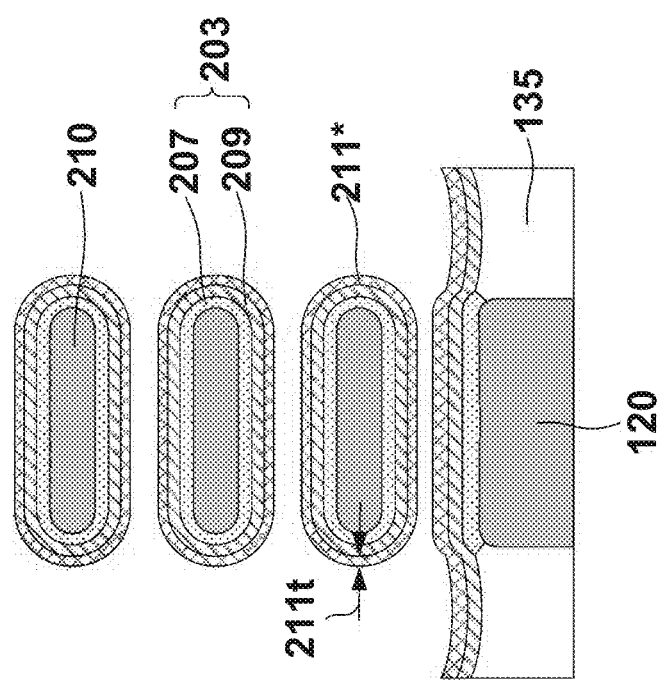

Referring to FIG. 5, method 500 continues with operation 520 and the process of forming a work function metal layer on the gate dielectric layer. For example, as shown in FIG. 9, work function metal layer 211* can be formed on gate dielectric layer 203. FIG. 9 illustrates a cross-sectional view of semiconductor device 100 shown in FIG. 8 after operation 520, in accordance with some embodiments. In some embodiments, work function layer 211* can include TiN, TiSiN, WN, WCN, or other suitable work function metals. In some embodiments, work function layer 211* can be deposited on gate dielectric layer 203 by ALD, CVD, and other suitable deposition methods at a temperature from about 150° C. to about 550° C. under a pressure from about 0.1 torr to about 50 torr. In some embodiments, work function metal layer 211* can have a thickness ranging from about 1 nm to about 10 nm.

Figure 10:
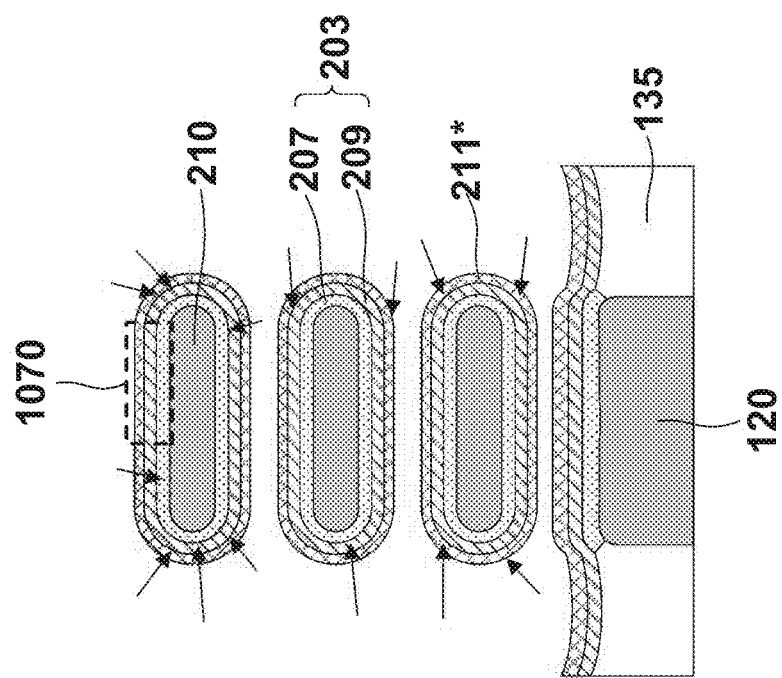
Figure 11:
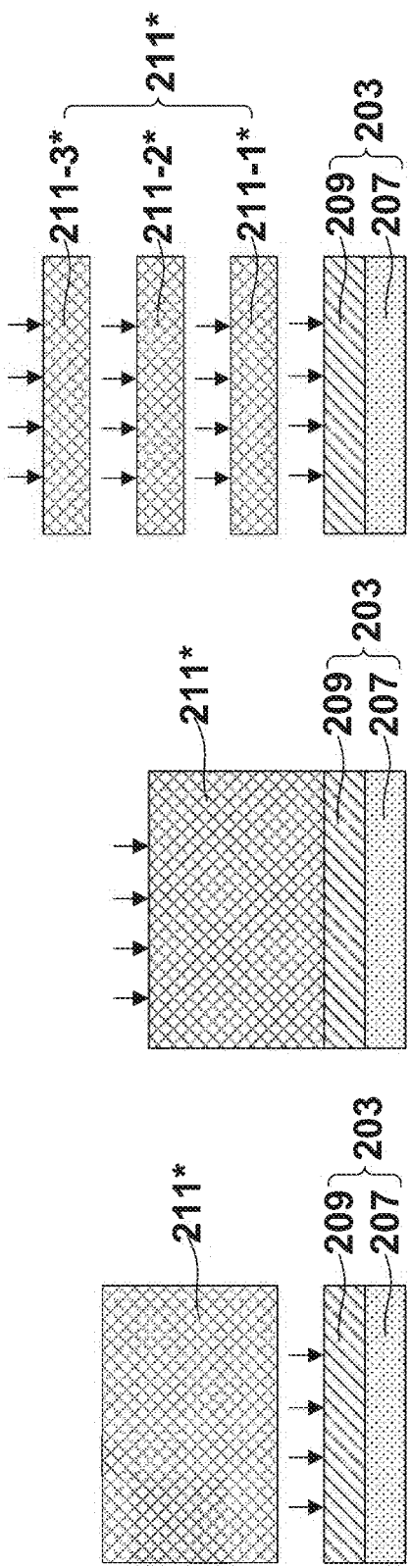

Referring to FIG. 5, in operation 530, the work function metal layer and the gate dielectric layer is doped with tantalum. For example, as shown in FIGS. 10 and 11A-11C, work function metal layer 211* and gate dielectric layer 203 can be doped with tantalum by a soak process. FIG. 10 illustrates a cross-sectional view of semiconductor device 100 shown in FIG. 9 after operation 530, in accordance with some embodiments. FIGS. 11A-11C illustrate enlarged cross-sectional views of region 1070 in FIG. 10, in accordance with some embodiments. In some embodiments, the arrows in FIGS. 10 and 11A-11C can indicate the tantalum diffusion during the soak process, In some embodiments, the soak process can use a tantalum precursor, such as PDMAT ($Ta(N(CH_3)_2)_5$) gas and tantalum chloride ($TaCl_5$) gas. In some embodiments, the soak process can be performed at a temperature from about 150° C. to about 550° C. under a pressure from about 0.1 torr to about 50 torr. If the temperature is less than about 150° C., or the pressure is less than about 0.1 torr, tantalum may not be doped in work function metal layer 211* or gate dielectric layer 203. As a result, oxygen diffused into gate dielectric layer 203 may not be mitigated and the electrical performance of semiconductor device 100 may not be improved. If the temperature is greater than about 150° C., or the pressure is greater than about 50 torr, excessive tantalum may be doped in work function metal layer 211* and gate dielectric layer 203, and the excessive tantalum may cause defects in gate dielectric layer 203 and decrease the uniformity of gate dielectric layer 203. The decrease of the uniformity of gate dielectric layer 203 can degrade the electrical performance of semiconductor device 100.

In some embodiments, the soak process can be performed for a time period ranging from about 0.5 s to about 1800 s. The time period of the soak process can control the tantalum concentration in work function metal layer 211* and gate dielectric layer 203. If the time period is less than about 0.5 s, the tantalum concentration in work function metal layer 211* and gate dielectric layer 203 may be less than about 0.05% and oxygen diffused into gate dielectric layer 203 may not be mitigated. If the time period is greater than about 1800 s, the tantalum concentration in work function metal layer 211* and gate dielectric layer 203 may be greater than about 25% and the excessive tantalum in gate dielectric layer 203 may cause defects in gate dielectric layer 203 and decrease the uniformity of gate dielectric layer 203.

In some embodiments, as shown in FIG. 11A, the soak process can be performed on high-k dielectric layer 209 before the deposition of work function metal layer 211*. The tantalum can diffuse into gate dielectric layer 203 and mitigate oxygen diffusion to interfacial layer 207 and the interface between interfacial layer 207 and high-k dielectric layer 209. In some embodiments, as shown in FIG. 11B, the soak process can be performed after the deposition of work function metal layer 211*. The tantalum can diffuse through work function metal layer 211* and dope work function metal layer 211* and gate dielectric layer 203, In some embodiments, as shown in FIG. 11C, the soak process can be performed multiple times after the deposition of each work function metal sublayers 211-1*, 211-2*, and 211-3*. In some embodiments, each of work function metal sublayers 211-1*, 211-2*, and 211-3* can have a -thickness ranging from about 0.5 nm to about 1.5 nm.

Figure 12:
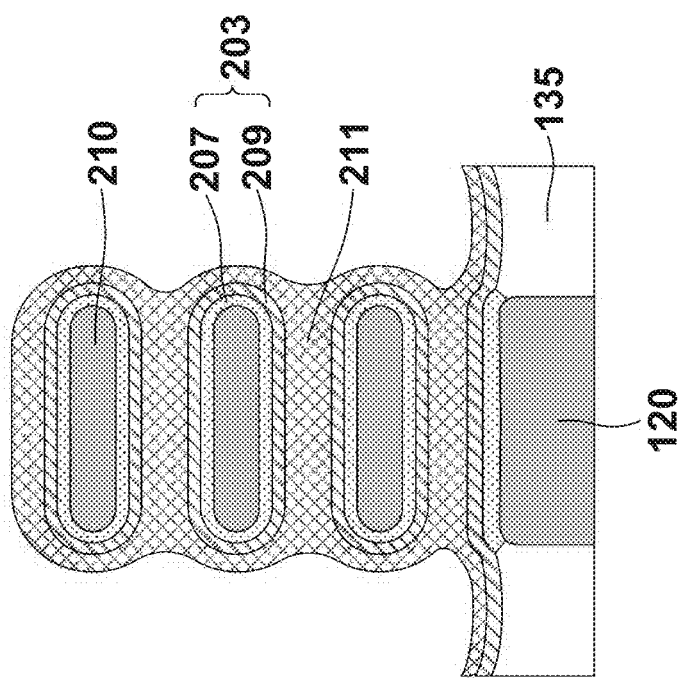
Figure 13:
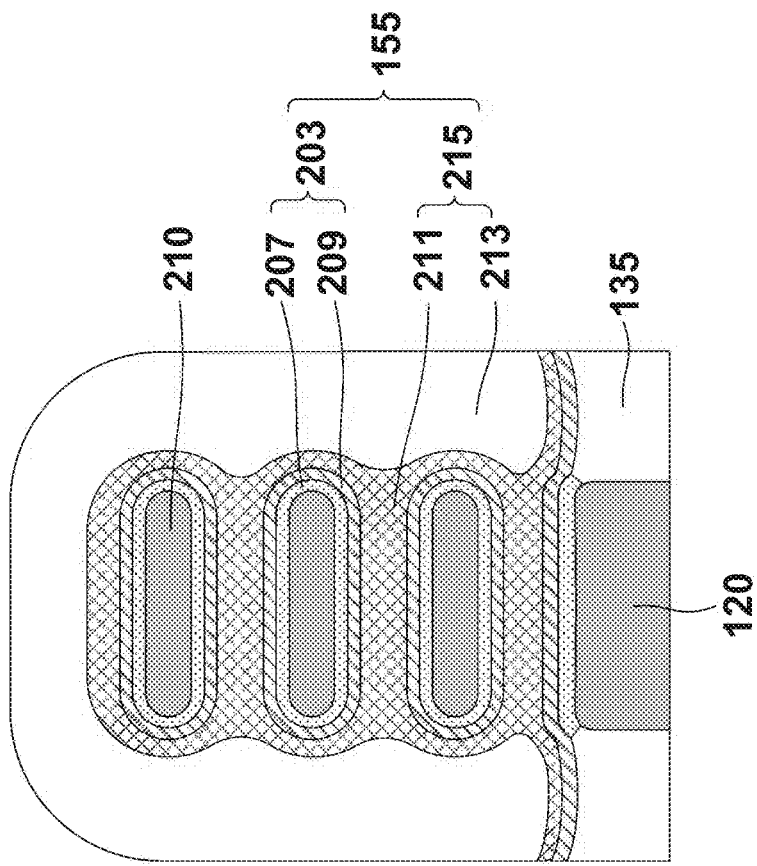

Referring to FIG. 5, in operation 540, a metal fill can be formed on the work function metal layer. For example, as shown in FIGS. 12 and 13, metal fill 213 can be formed on work function metal layer 211, In some embodiments, prior to the formation of metal fill 213, a glue layer can be deposited on work function metal layer 211*, as shown in FIG. 12. The glue layer can include the same conductive material as work function metal layer 211, such as TiN. Accordingly, the glue layer can be part of work function metal layer 211, as shown in FIG. 12. In some embodiments, the glue layer can be deposited by ALD, CVD, and other suitable deposition methods at a temperature from about 150° C. to about 550° C. under a pressure from about 0.1 torr to about 50 torr. In some embodiments, the glue layer can have a thickness ranging from about 25 Å to about 200 Å.

In some embodiments, metal fill 213 can include a single metal layer or a stack of metal layers. The stack of metal layers can include metals different from each other. In some embodiments, metal fill 213 can include a suitable conductive material, such as titanium, tantalum, aluminum, cobalt, tungsten, nickel, ruthenium, metal alloys, and/or combinations thereof. In some embodiments, metal fill 213 can be deposited by CVD, physical vapor deposition (PVD), and other suitable deposition methods. After the deposition of metal fill 213, work function metal layer 211 and metal fill 213 can form metal gate 215.

Figure 14:
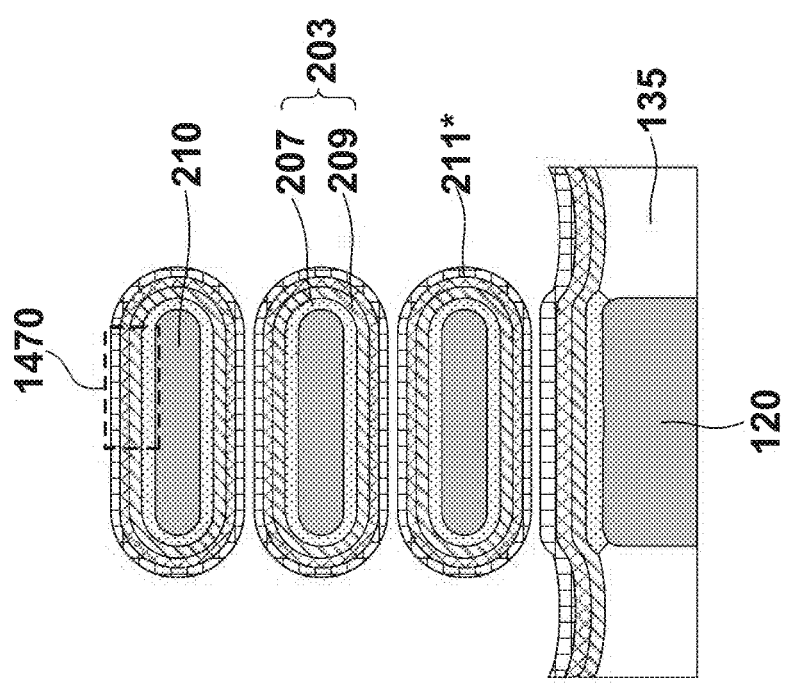

In some embodiments, one or more tantalum nitride layers can be deposited on gate dielectric layer 203 during the formation of work function metal layer 211 to dope tantalum in work function metal layer 211 and gate dielectric layer 203, as shown in FIGS. 14, 15A, 15B, 16, and 17. FIG. 14 illustrates a cross-sectional view of semiconductor device 100 shown in FIG. 8 after operations 520 and 530, in accordance with some embodiments. FIGS. 15A and 15B illustrate enlarged cross-sectional views of region 1470 in FIG. 14, in accordance with some embodiments. In some embodiments, as shown in FIG. 15A, work function metal layer 211* can include work function metal sublayers 211A1, 211A2, and 211A3. Work function metal sublayers 211A1 and 211A3 can include the same work function material, such as TiN. Work function metal sublayer 211A2 can include another work function material, such as TaN, different from work function metal sublayers 211A1 and 211A3. In some embodiments, as shown in FIG. 15B, work function metal layer 211* can include work function metal sublayers 211B1, 211B2, 211B3, and 211B4. Work function metal sublayers 211B1 and 211B3 can include the same work function material, such as TiN. Work function metal sublayer 211B2 and 211B4 can include another work function material, such as TaN, different from work function metal sublayers 211B1 and 211B3.

In some embodiments, work function metal sublayers 211A1, 211A2, and 211A3 can be deposited on gate dielectric layer 203 by ALD, CVD, and other suitable deposition methods at a temperature from about 150° C. to about 550° C. under a pressure from about 0.1 torr to about 50 torr. In some embodiments, work function metal sublayers 211A1 and 211A3 can be deposited with a titanium precursor in the same chamber. The titanium precursor can include titanium chloride (TiCl4) or other suitable titanium precursor. In some embodiments, work function metal sublayer 211A2 can be deposited with a tantalum precursor in another chamber different from work function metal sublayers 211A1 and 211A3. The tantalum precursor can include titanium PDMAT, TaCl5, or other suitable tantalum precursor. Accordingly, after deposition of work function metal sublayer 211A1, the deposition process for work function metal sublayer 211A2 can have a vacuum break, which can be referred to as an "ex situ" deposition. Similarly, the deposition process for work function metal sublayer 211A3 after deposition of work function metal sublayer 211A2 can be an ex situ deposition. In some embodiments, work function metal sublayers 211A1, 211A2, and 211A3 can be deposited in the same chamber with a titanium precursor for work function metal sublayers 211A1 and 211A3 and a tantalum precursor for work function metal sublayer 211A2. The deposition process of work function metal sublayers 211A1, 211A2, and 211A3 can have no vacuum break, which can be referred to as an "in situ" deposition. Accordingly, work function metal sublayers 211A2 and 211A3 can be in situ deposited or ex situ deposited. In some embodiments, work function metal sublayers 211B1, 211B2, 211B3, and 211B4 can be deposited by the same method as work function metal sublayers 211A1, 211A2, and 211A3.

In some embodiments, as shown in FIGS. 15A and 15B, work function metal sublayers 211* can include TiN and TaN layers stacked in an alternate configuration. In some embodiments, work function metal sublayers 211A1 and 211B1 can include TiN but may not include TaN, because TaN on gate dielectric layer 203 may increase Vt of PFET devices and degrade device performance. In some embodiments, work function metal sublayers 211A3 and 211B4 can include TiN or TaN as a top layer of work function metal layer 211 *. In some embodiments, the atomic bond of tantalum in work function metal sublayers 211A2, 211B2, and 211B4 can be broken during the deposition process and tantalum can diffuse to adjacent work function metal sublayers and gate dielectric layer 203 under the deposition temperature from about 150° C. to about 550° C. As a result, work function metal layers 211* and gate dielectric layer 203 can be doped with tantalum by the alternate configuration of stacked TiN and TaN layers after the deposition process.

In some embodiments, the tantalum concentration in work function metal sublayers 211A2, 211B2, and 211B4 can range from about 40% to about 60%. In some embodiments, the concentration of the doped tantalum in work function metal sublayers 211A1, 211A3, 211B1, and 211B3, high-k dielectric layer 209, and interfacial layer 207 can range from about 0.05% to about 25%. If the tantalum concentration is less than about 0.05%, the doped tantalum in gate dielectric layer 203 and work function metal sublayers 211A1, 211A3, 211B1, and 211B3 may not be able to prevent oxygen from diffusing to interfacial layer 207 and the interface between interfacial layer 207 and high-k dielectric layer 209. As a result, the electrical performance of semiconductor device 100 may not be improved. If the tantalum concentration is greater than about 25%, the excessive tantalum may cause defects in gate dielectric layer 203 and decrease the uniformity of gate dielectric layer 203. The decrease of the uniformity of gate dielectric layer 203 can degrade the electrical performance of semiconductor device 100.

In some embodiments, each of work function metal sublayers 211A1, 211A3, 211B1, and 211B3 can include TiN having a thickness 211$t$1 ranging from about 0.5 nm to about 1.5 nm. In some embodiments, work function metal sublayers 211A2, 211B2, and 211B4 can include TaN having a thickness 211$t$2 ranging from about 0.5 nm to about 1.5 nm. In some embodiments, a ratio between thickness 211$t$2 to thickness 211$t$1 can range from about 0.1 to about 1.5. If the ratio is less than about 0.1, the tantalum concentration in work function layer 211* and gate dielectric layer 203 can be less than about 0.05% and the doped tantalum in dielectric layer 203 may not be able to prevent oxygen diffusing to interfacial layer 207 and the interface between interfacial layer 207 and high-k dielectric layer 209. If the ratio is greater than about 1.5, the tantalum concentration in work function layer 211* and gate dielectric layer 203 can be greater than about 25% and the excessive tantalum may cause defects in gate dielectric layer 203 and decrease the uniformity of gate dielectric layer 203.

Figure 17:
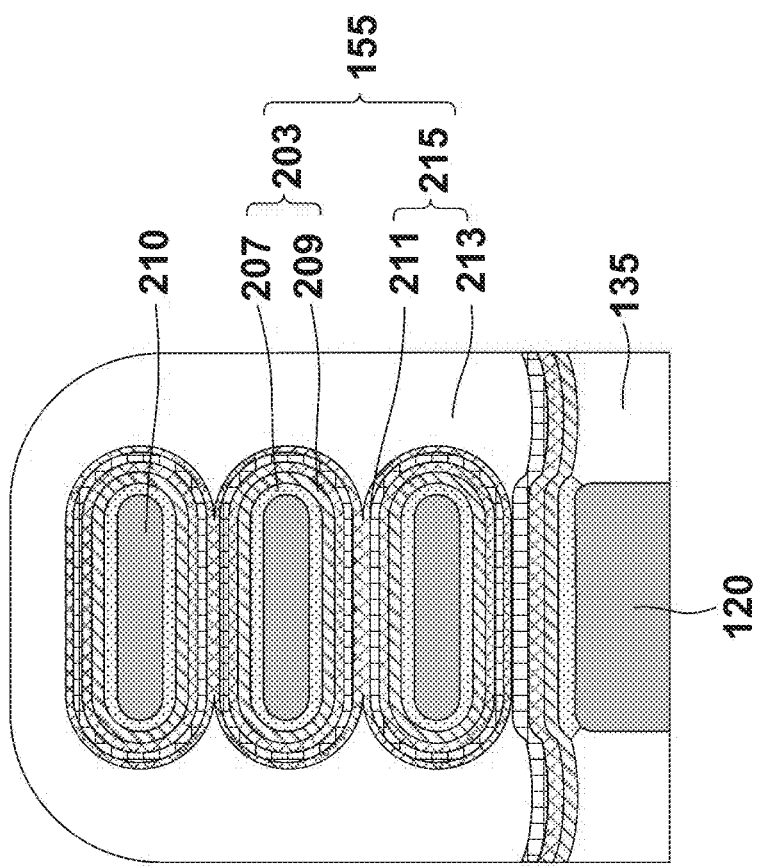

In some embodiments, the formation of work function metal layer 211* can be followed by depositing a glue layer on work function metal layer 211* to form work function metal layer 211, as shown in FIG. 16. In some embodiments, the glue layer can be deposited by the same method and include the same conductive material as the glue layer described in FIG. 12. In some embodiments, the formation of work function metal layer 211 can be followed by depositing a metal fill 213 on the glue layer, as shown in FIG. 17. In some embodiments, metal fill 213 can be deposited by the same method and include the same conductive material as metal fill 213 described in FIG. 13.

Figure 18:
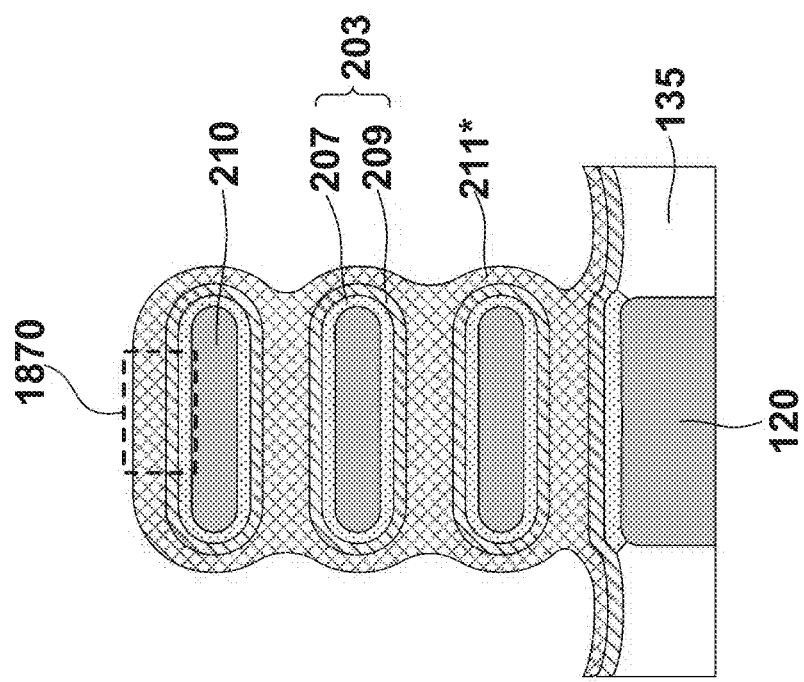
Figure 19:
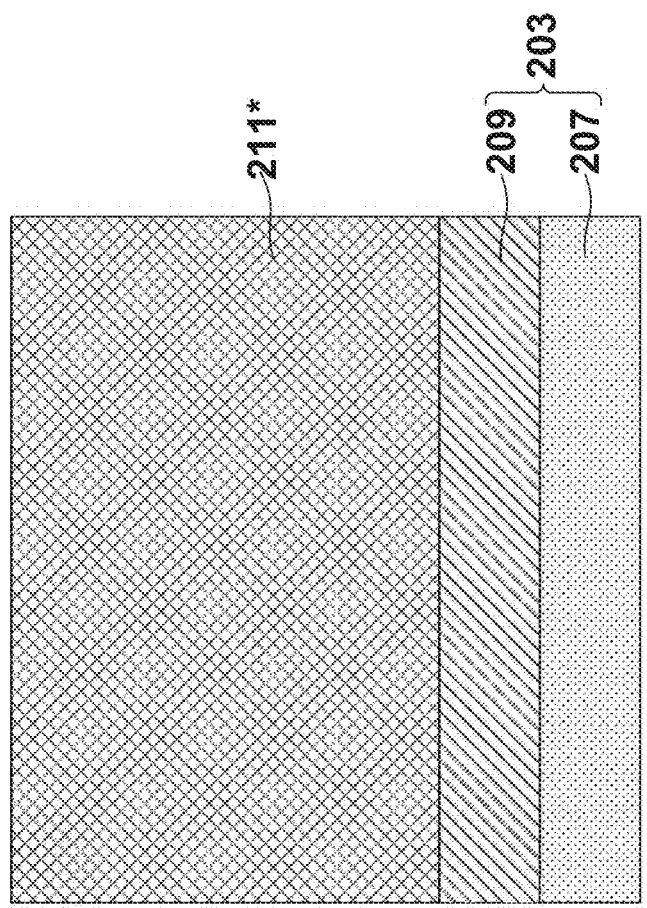
Figure 20:
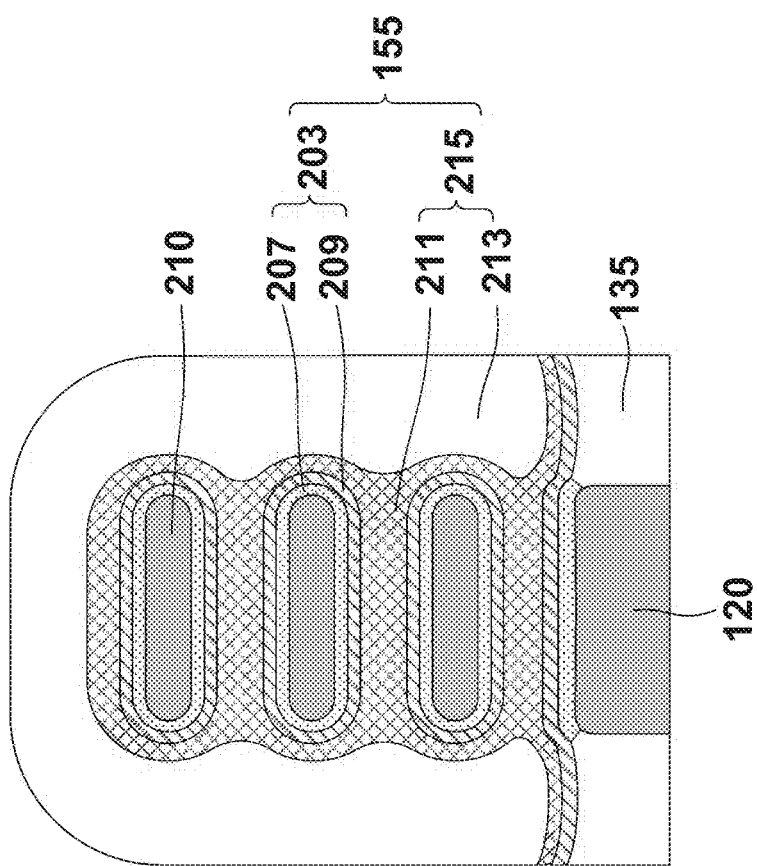

In some embodiments, work function metal layer 211 can include a work function material of TiTaN to dope tantalum in work function metal layer 211 and gate dielectric layer 203, as shown in FIGS. 18-20. FIG. 18 illustrates a cross-sectional view of semiconductor device 100 shown in FIG. 8 after operations 520 and 530, in accordance with some embodiments. FIG. 19 illustrates an enlarged cross-sectional view of region 1870 in FIG. 18, in accordance with some embodiments. In some embodiments, as shown in FIG. 19, work function metal layer 211* can include a work function material having tantalum, such as TiTaN. In some embodiments, the tantalum concentration in work function metal layer 211* can range from about 0.05% to about 25%. If the tantalum concentration is less than about 0.05%, the tantalum in work function metal layer 211* and gate dielectric layer 203 may not be able to prevent oxygen from diffusing to interfacial layer 207 and the interface between interfacial layer 207 and high-k dielectric layer 209. As a result, the electrical performance of semiconductor device 100 may not be improved. If the tantalum concentration is greater than about 25%, the excessive tantalum may cause defects in gate dielectric layer 203 and decrease the uniformity of gate dielectric layer 203. The decrease of the uniformity of gate dielectric layer 203 can degrade the electrical performance of semiconductor device 100.

In some embodiments, work function metal layer 211* can be deposited on gate dielectric layer 203 by ALD, CVD, and other suitable deposition methods at a temperature from about 150° C. to about 550° C. under a pressure from about 0.1 torr to about 50 torr. In some embodiments, work function metal layer 211* can be deposited using a titanium precursor (e.g., TiCl4), a tantalum precursor (e.g., PDMAT), and a nitrogen precursor (e.g., ammonia (NH3)) to form TiTaN. In some embodiments, work function metal layer 211* can be deposited in a chamber by a sequence of the precursors. The sequence of the precursors can include a first cycle of the titanium precursor, a second cycle of the nitrogen precursor, a third cycle of the tantalum precursor, and a fourth cycle of the nitrogen precursor. In some embodiments, the titanium precursor can be delivered to the chamber for a first pulse time during the first cycle and the tantalum precursor can be delivered to the chamber for a second pulse time during the third cycle. In some embodiments, a ratio of first pulse time to the second pulse time can range from about 0.15 to about 10. If the ratio is less than about 0.15, the tantalum concentration in work function layer 211* can be less than about 0.05% and the tantalum in work function layer 211* may not be able to prevent oxygen diffusion. If the ratio is greater than about 10, the tantalum concentration in work function layer 211* can be greater than about 25%. The excessive tantalum may cause defects in gate dielectric layer 203 and decrease the uniformity of gate dielectric layer 203. In some embodiments, the first cycle can include the titanium precursor but may not include the tantalum precursor, because tantalum deposited on gate dielectric layer 203 may increase Vt of PFET devices and degrade device performance. In some embodiments, the deposited tantalum can diffuse into gate dielectric layer 203 during the deposition process. The doped tantalum in gate dielectric layer 203 can attract oxygen and mitigate oxygen diffusion. In some embodiments, additional cycles of the titanium precursor, the nitrogen precursor, the tantalum precursor can be delivered to the chamber in the same sequence as the first four cycles to form work function metal layer 211 *. In some embodiments, work function metal layer 211* can have a thickness ranging from about 1 nm to about 10 nm.

In some embodiments, the formation of work function metal layer 211* can be followed by depositing a glue layer on work function metal layer 211* to form work function metal layer 211, which can be followed by depositing a metal fill 213 on the glue layer, as shown in FIG. 20. In some embodiments, the glue layer can be deposited by the same method and include the same conductive material as the glue layer described in FIG. 12. In some embodiments, metal fill 213 can be deposited by the same method and include the same conductive material as metal fill 213 described in FIG. 13.

In some embodiments, the formation of work function metal layer 211 and metal fill 213 can be followed by a chemical mechanical polishing (CMP) process to planarize top surfaces of gate structure 155, gate spacers 160, etch stop layer 145, and isolation layer 150. In some embodiments, additional operations can follow the CMP process to form contacts on S/D structures 140, contacts on gate structure 155, interconnects, and other structures for semiconductor device 100, which are not described in detail for simplicity.

Various embodiments of the present disclosure provide methods for forming semiconductor device 100 having a tantalum doped work function metal layer 211 to prevent oxygen diffusion and improve device threshold voltage. In some embodiments, work function metal layer 211 and gate dielectric layer 203 can be doped with tantalum by a soak process with a tantalum precursor. The tantalum in work function metal layer 211 and gate dielectric layer 203 can attract oxygen and prevent oxygen from diffusing into interfacial layer 207 and the interface between interfacial layer 207 and high-k dielectric layer 209. In some embodiments, work function metal layer 211 can include one or more tantalum nitride layers to dope tantalum in work function metal layer 211 and gate dielectric layer 203 and thus to mitigate oxygen diffusion. In some embodiments, work function metal layer 211 can include TiTaN to mitigate oxygen diffusion. The tantalum in the TiTaN work function metal layer can have a concentration ranging from about 0.05% to about 25%, and the tantalum can diffuse into gate dielectric layer 203 to attract oxygen and mitigate oxygen diffusion. In some embodiments, the tantalum concentration in work function metal layer 211 and gate dielectric layer 203 can range from about 0.05% to about 25%. In some embodiments, with tantalum doping in work function metal layer 211 and gate dielectric layer 203, Vt shift in PFETs 105A and 105B can be reduced by about 20 mV to about 100 mV and device performance of semiconductor device 100 can be improved.

In some embodiments, a method includes forming a gate dielectric layer on a channel structure and forming a work function metal layer on the gate dielectric layer. The gate dielectric layer includes an interfacial layer on the channel structure and a high-k dielectric layer on the interfacial layer. The method further includes doping the work function metal layer and the gate dielectric layer with tantalum.

In some embodiments, a method includes forming a gate dielectric layer on a channel structure. The gate dielectric layer includes an interfacial layer on the channel structure and a high-k dielectric layer on the interfacial layer. The method further includes depositing a work function metal layer on the gate dielectric layer with a titanium precursor, a nitrogen precursor, and a tantalum precursor and forming a metal fill on the work function metal layer.

In some embodiments, a semiconductor device includes a channel structure on a substrate, an interfacial layer on the channel structure, a high-k dielectric layer on the interfacial layer, and a work function metal layer on the high-k dielectric layer. The work function metal layer includes tantalum having a concentration ranging from about 0.05% to about 25%.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate dielectric layer on a channel structure, wherein the gate dielectric layer comprises an interfacial layer on the channel structure and a high-k dielectric layer on the interfacial layer;
   forming a work function metal layer on the gate dielectric layer; and
   diffusing tantalum into the work function metal layer and the gate dielectric layer.

2. The method of claim 1, wherein doping the work function metal layer and the gate dielectric layer comprises soaking the work function metal layer with a tantalum precursor for about 0.5 second to about 1800 seconds.

3. The method of claim 1, wherein doping the work function metal layer and the gate dielectric layer comprises forming a tantalum nitride layer on a titanium nitride layer.

4. The method of claim 3, wherein a ratio of a thickness of the tantalum nitride layer to a thickness of the titanium nitride layer ranges from about 0.1 to about 1.5.

5. The method of claim 1, further comprising:
   forming an additional work function metal layer on the work function metal layer; and
   doping the additional work function metal layer with the tantalum.

6. The method of claim 1, further comprising:
   forming a glue layer on the work function metal layer; and
   forming a metal fill on the glue layer.

7. The method of claim 1, wherein doping the work function metal layer and the gate dielectric layer comprises performing the doping at a temperature from about 150° C. to about 550° C.

8. The method of claim 1, wherein doping the work function metal layer and the gate dielectric layer comprises performing the doping under a pressure from about 0.1 torr to about 50 torr.

9. The method of claim 1, wherein the work function metal layer is a p-type work function metal comprising titanium nitride, tungsten nitride, tungsten carbon nitride, or titanium silicon nitride.

10. A method, comprising:
    forming a gate dielectric layer on a channel structure, wherein the gate dielectric layer comprises an interfacial layer on the channel structure and a high-k dielectric layer on the interfacial layer;
    depositing a work function metal layer on the gate dielectric layer with a titanium precursor, a nitrogen precursor, and a tantalum precursor;
    diffusing tantalum in the work function metal layer into the gate dielectric layer; and
    forming a metal fill on the work function metal layer.

11. The method of claim 10, wherein depositing the work function metal layer comprises:
    delivering the titanium precursor for a first pulse time; and
    delivering the tantalum precursor for a second pulse time different from the first pulse time.

12. The method of claim 11, wherein a ratio of the first pulse time to the second pulse time ranges from about 0.15 to about 10.

13. The method of claim 10, wherein depositing the work function metal layer comprises performing the deposition at a temperature from about 150° C. to about 550° C.

14. The method of claim 10, wherein depositing the work function metal layer comprises performing the deposition under a pressure from about 0.1 torr to about 50 torr.

15. A method, comprising:
    forming a gate dielectric layer in a gate stack opening, wherein the gate dielectric layer comprises an interfacial layer and a high-k dielectric layer;
    forming a work function metal layer on the gate dielectric layer;
    diffusing tantalum into the work function metal layer and the gate dielectric layer under a thermal condition; and
    depositing a metal fill in the gate stack opening and on the work function layer.

16. The method of claim 15, wherein forming the work function metal layer comprises soaking the work function metal layer and the high-k dielectric layer with a tantalum precursor for about 0.5 second to about 1800 seconds.

17. The method of claim 16, wherein the work function metal layer and the high-k dielectric layer are soaked at a temperature from about 150° C. to about 550° C.

18. The method of claim 16, wherein the work function metal layer and the high-k dielectric layer are soaked under a pressure from about 0.1 torr to about 50 torr.

19. The method of claim 15, wherein forming the work function metal layer comprises:
    forming a titanium nitride layer on the high-k dielectric layer; and
    forming a tantalum nitride layer on the titanium nitride layer.

20. The method of claim 19, wherein a ratio of a thickness of the tantalum nitride layer to a thickness of the titanium nitride layer ranges from about 0.1 to about 1.5.

* * * * *